(12) United States Patent
Wong et al.

(10) Patent No.: US 12,347,628 B1
(45) Date of Patent: Jul. 1, 2025

(54) STACKABLE AND EMBEDDABLE VERTICAL CAPACITORS IN SEMICONDUCTOR DEVICES AND METHOD OF FABRICATION

(71) Applicant: Saras Micro Devices, Inc., Chandler, AZ (US)

(72) Inventors: Ryan Wong, Atlanta, GA (US); Carlos Andres Riera Cercado, Atlanta, GA (US); Richard Sheridan, Gilbert, AZ (US); Imran Khan, Alpharetta, GA (US)

(73) Assignee: Saras Micro Devices, Inc., Chandler, AZ (US)

( * ) Notice: Subject to any disclaimer, the term of this patent is extended or adjusted under 35 U.S.C. 154(b) by 0 days.

(21) Appl. No.: 18/816,975

(22) Filed: Aug. 27, 2024

(51) Int. Cl.

| H01G 4/38 | (2006.01) |
|---|---|
| H01L 23/64 | (2006.01) |
| H10D 1/00 | (2025.01) |
| H10D 1/68 | (2025.01) |
| H10D 84/00 | (2025.01) |
| H01G 4/232 | (2006.01) |
| H01G 4/30 | (2006.01) |

(52) U.S. Cl.
CPC ............ H01G 4/38 (2013.01); H01L 23/642 (2013.01); H10D 1/043 (2025.01); H10D 1/714 (2025.01); H10D 84/212 (2025.01); H01G 4/232 (2013.01); H01G 4/30 (2013.01)

(58) Field of Classification Search
CPC ...... H10D 1/692; H10D 1/714; H10D 84/212; H10D 1/041; H10D 1/043; H01G 2/06; H01G 2/065; H01G 2/10; H01G 2/103; H01G 2/106; H01G 4/30; H01G 4/01; H01G 4/012; H01G 4/232; H01G 4/38
See application file for complete search history.

(56) References Cited

U.S. PATENT DOCUMENTS

| 5,088,003 | A | * | 2/1992 | Sakai | ............... H01G 4/10 |
| | | | | | 29/25.42 |
| 6,368,514 | B1 | * | 4/2002 | Metzler | ............... H01G 4/306 |
| | | | | | 216/6 |
| 8,753,952 | B2 | * | 6/2014 | Summerfelt | ............... H10D 1/62 |
| | | | | | 257/532 |
| 9,230,944 | B1 | * | 1/2016 | Lambert | ............... H01L 23/49822 |
| 2007/0045814 | A1 | * | 3/2007 | Yamamoto | ............... H05K 1/0231 |
| | | | | | 257/E23.062 |

(Continued)

FOREIGN PATENT DOCUMENTS

| CN | 106601905 A | * | 4/2017 | ....... H01L 21/76895 |
| CN | 113471176 B | * | 2/2024 | ......... H01L 21/4853 |

*Primary Examiner* — Scott B Geyer
(74) *Attorney, Agent, or Firm* — Stetina Garred Brucker & Newboles

(57) ABSTRACT

A stackable, embeddable capacitor has one or more first type vertical capacitor elements, each of which has a top cathode, a bottom anode, and a first orientation central capacitance region between the top cathode and the bottom anode. The capacitor also has one or more second type vertical capacitor elements, each of which has a bottom cathode, a top anode, and a second orientation central capacitance region between the bottom cathode and the top anode. The second type vertical capacitor elements are alternatingly stacked on the first type vertical capacitor elements.

20 Claims, 10 Drawing Sheets

(56) References Cited

U.S. PATENT DOCUMENTS

| | | | |
|---|---|---|---|
| 2007/0230088 A1* | 10/2007 | Fujimura | C04B 35/638 |
| | | | 257/E21.082 |
| 2008/0291602 A1* | 11/2008 | Devoe | H05K 3/3426 |
| | | | 361/306.3 |
| 2009/0034155 A1* | 2/2009 | Devoe | H01G 4/38 |
| | | | 361/306.3 |
| 2010/0053842 A1* | 3/2010 | Devoe | H05K 1/181 |
| | | | 361/306.3 |
| 2012/0074521 A1* | 3/2012 | Imanaka | B82Y 30/00 |
| | | | 156/247 |
| 2015/0041196 A1* | 2/2015 | Kim | H01G 4/2325 |
| | | | 361/301.4 |
| 2015/0053471 A1* | 2/2015 | Lee | H01G 4/01 |
| | | | 361/301.4 |
| 2015/0069573 A1* | 3/2015 | Huang | H01L 23/642 |
| | | | 257/532 |
| 2015/0163919 A1* | 6/2015 | Nakagome | H01L 23/13 |
| | | | 174/255 |
| 2015/0206662 A1* | 7/2015 | Lamy | H10D 1/042 |
| | | | 216/6 |
| 2017/0019999 A1* | 1/2017 | Nakashima | H05K 3/4697 |
| 2020/0035417 A1* | 1/2020 | Sakurai | H01G 4/258 |
| 2020/0066447 A1* | 2/2020 | Murai | H01G 4/30 |
| 2020/0066922 A1* | 2/2020 | Cheng | H10D 1/714 |
| 2020/0118921 A1* | 4/2020 | Cheng | H01G 4/33 |
| 2020/0243259 A1* | 7/2020 | Berolini | H01G 4/12 |
| 2021/0391314 A1* | 12/2021 | Jeng | H01L 23/5383 |
| 2022/0051852 A1* | 2/2022 | Tanaka | H05K 1/185 |
| 2022/0336152 A1* | 10/2022 | Chen | H01G 4/30 |
| 2023/0006788 A1 | 1/2023 | Dai et al. | |
| 2023/0016558 A1* | 1/2023 | Shao | H10B 12/03 |
| 2023/0067888 A1 | 3/2023 | Sundaram et al. | |
| 2023/0290813 A1* | 9/2023 | Barlas | H10D 1/692 |
| 2024/0071693 A1* | 2/2024 | Kamo | H01G 4/012 |

* cited by examiner

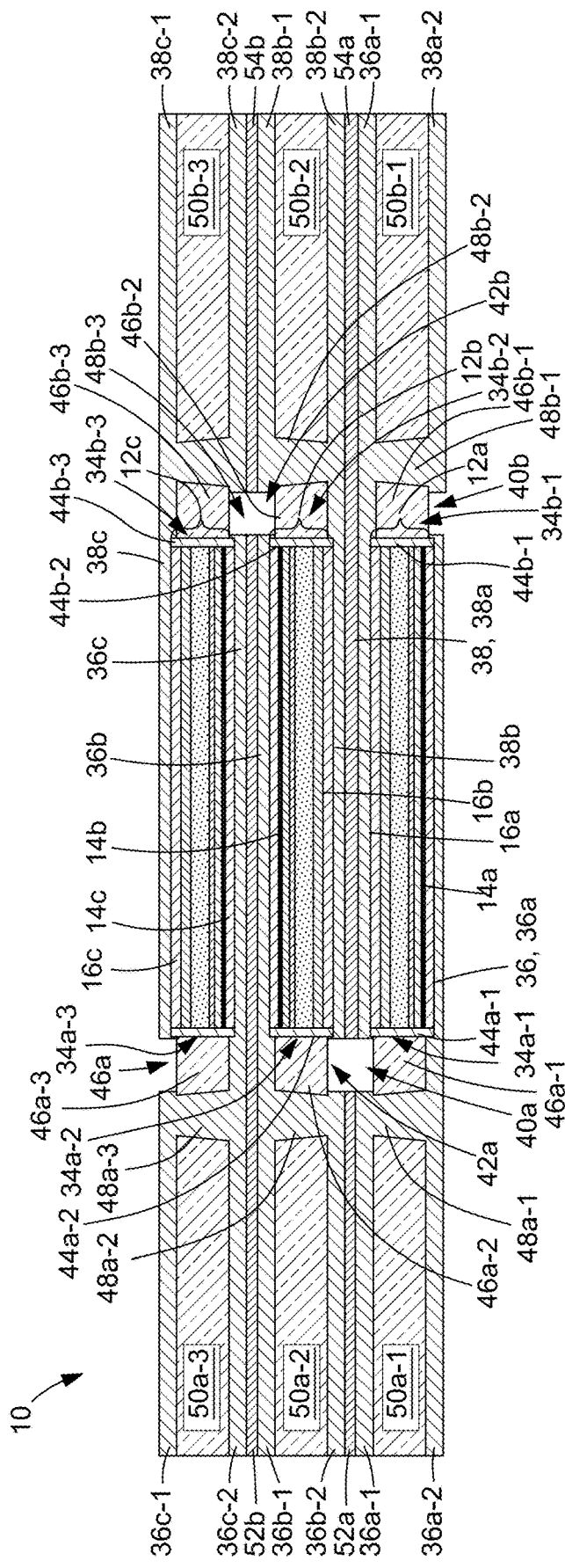
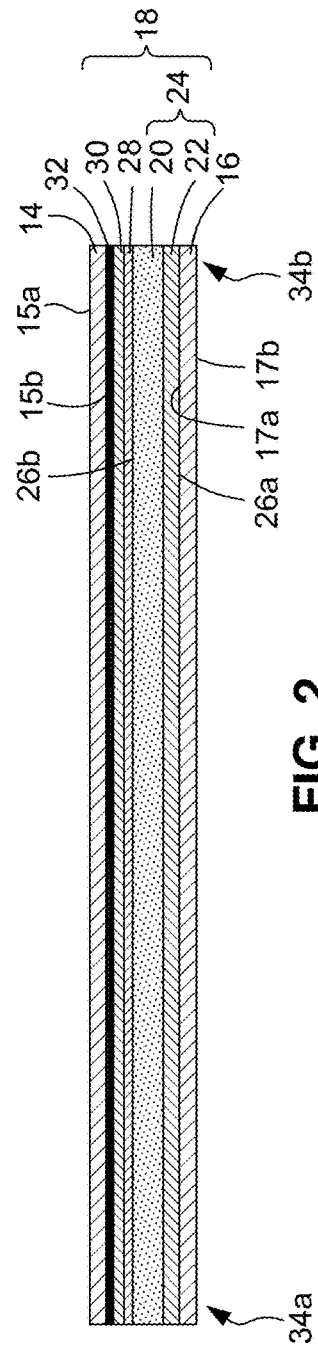
FIG. 1
FIG. 2

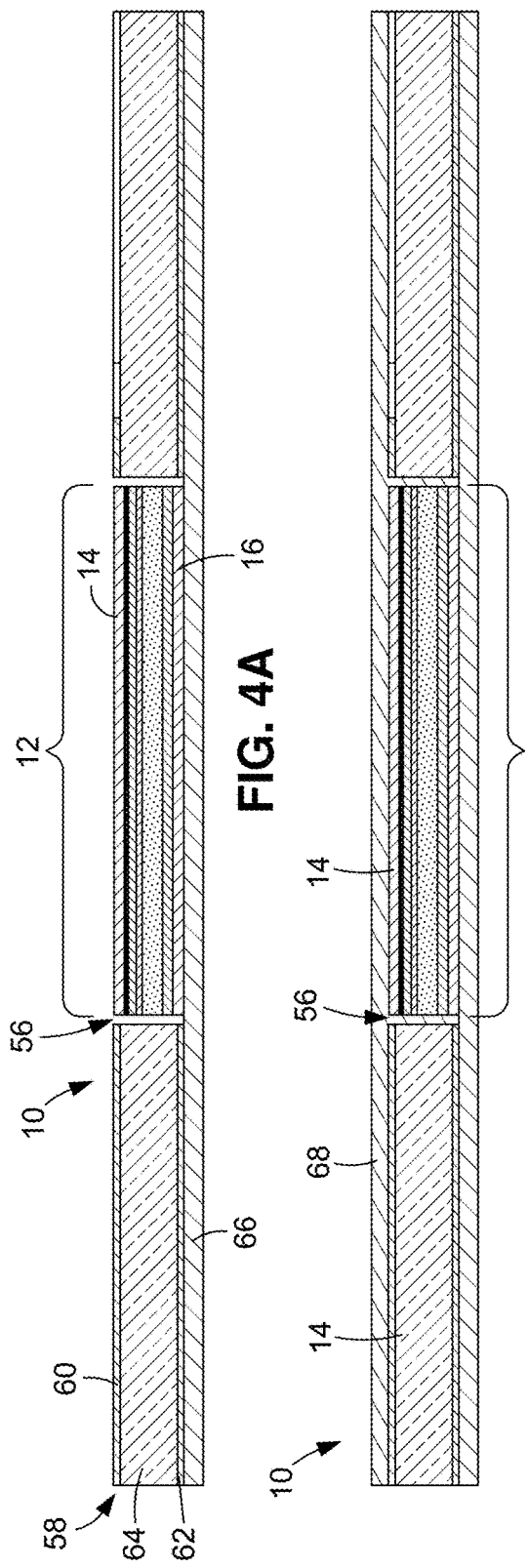

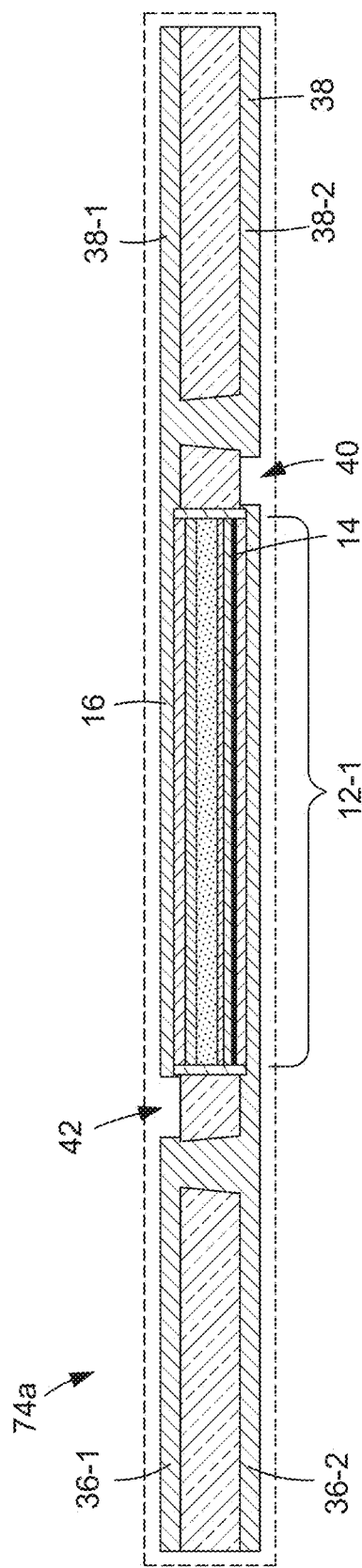
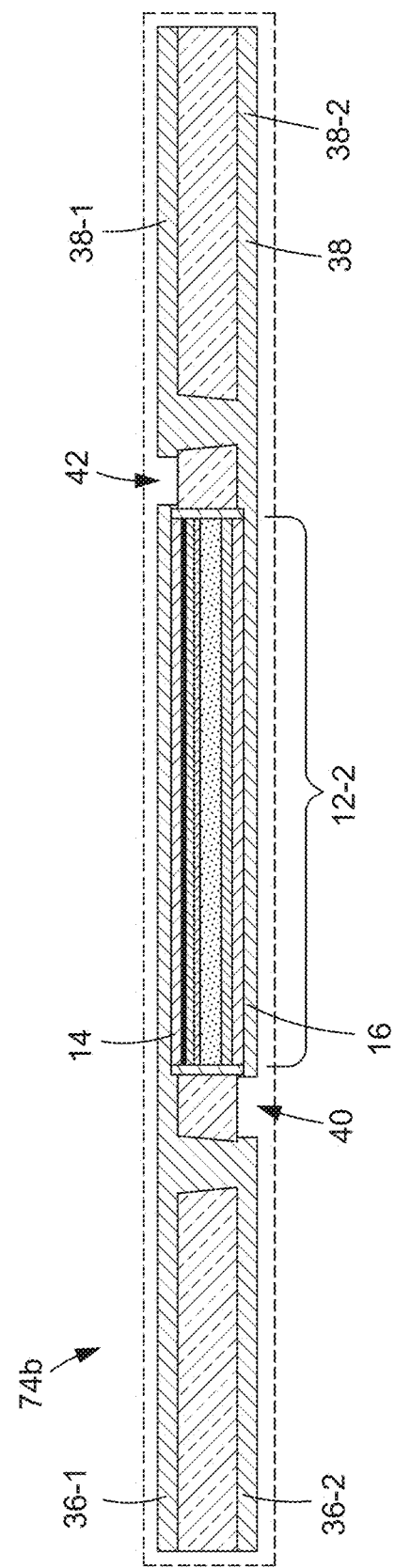
FIG. 5A
FIG. 5B

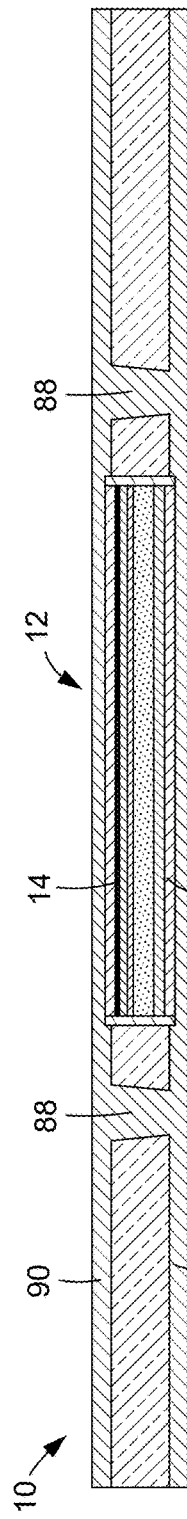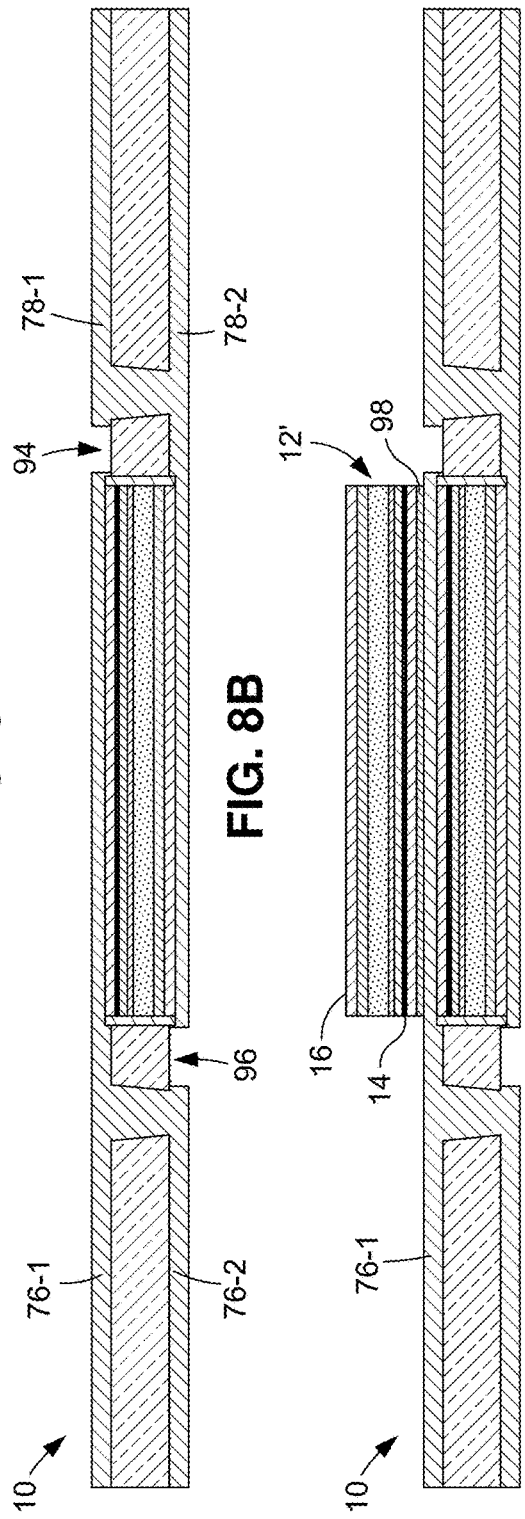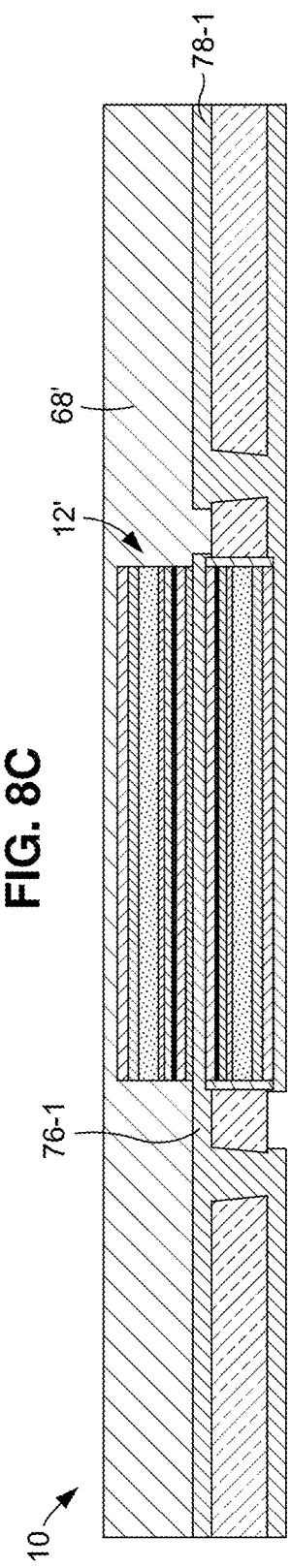

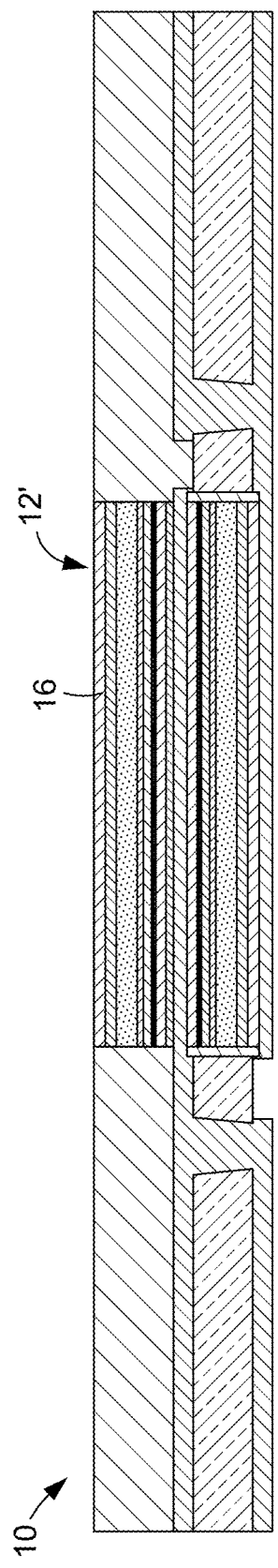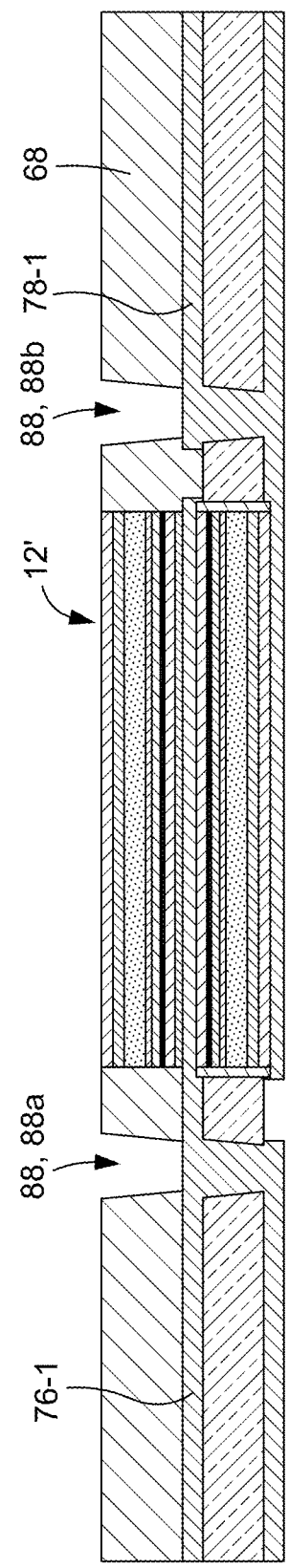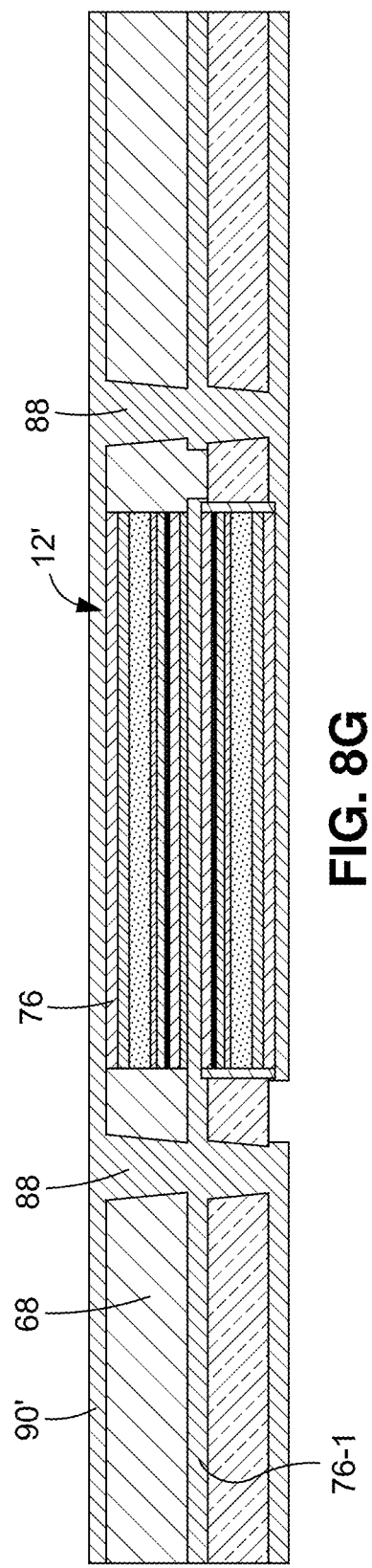

STACKABLE AND EMBEDDABLE VERTICAL CAPACITORS IN SEMICONDUCTOR DEVICES AND METHOD OF FABRICATION

CROSS-REFERENCE TO RELATED APPLICATIONS

Not Applicable

STATEMENT RE: FEDERALLY SPONSORED RESEARCH/DEVELOPMENT

Not Applicable

BACKGROUND

1. Technical Field

The present disclosure relates generally to passive electronic devices. More specifically, the present disclosure relates to stackable and embeddable vertical capacitors in semiconductor devices, and methods of fabricating the same.

2. Related Art

Capacitors are an important part of many integrated and embedded circuits and are commonly used as energy storage structures, as primary components in filters and other signal conditioning applications, and as specific components of other types of complex integrated circuits. Capacitors are commonly arranged as a pair of opposing thin electrodes separated by a dielectric, with electrical energy being stored as a consequence of equal and opposite charges on the opposing electrodes. Higher capacitance values may be achieved by a greater surface area of the electrode.

A wide variety of configurations of capacitors as well as packaging modalities are known in the art. In one basic configuration, the electrode and dielectric may be rolled into a tight cylindrical structure to optimize the surface area per unit volume. Another configuration may utilize deep trenches in silicon to benefit from more surface area. Still another configuration may be layers of dielectric and metal stacked and connected to each other.

One known vertical capacitor structure utilizes a single-sided porous metal foil, with different sides forming the cathode and anode components thereof. In particular, the metal foil may be selectively etched and anodized on one side to define the porous, high surface area, as well as an overlying dielectric layer.

Efforts to maximize capacitance and minimize equivalent series resistance (ESR) of capacitors have also led to the development of double-sided capacitors such as those described in co-owned U.S. Pat. App. Pub. No. 2023/006788, entitled "Planar High-Density Aluminum Capacitors for Stacking and Embedding," the entirety of the disclosure of which is incorporated by reference herein. A double-sided capacitor in accordance with the teachings of such disclosure may define a second electrode, e.g., a cathode, of a conductive polymer, metal, or ceramic that is disposed on both sides of a first electrode, e.g., an anode of aluminum that has been etched or otherwise modified to have a high surface area. An oxide layer may be formed between the first and second electrodes to serve as the dielectric.

There is a continuing need for performance gains with respect to low equivalent series resistance, capacitances, and functional density. It is also desirable for modularity and customizability to be maintained, and so there is a need in the art for vertical capacitor structures that are stackable and embeddable.

BRIEF SUMMARY

The present disclosure contemplates various embodiments of stackable and embeddable vertical capacitors, in which capacitor elements are stacked in parallel to desired performance and/or dimensional parameters. The capacitors may be embedded within substrates, or may be fabricated into discrete form factors. Various embodiments also include methods for fabricating the stackable and embeddable vertical capacitors.

According to one embodiment, there may be a stacked vertical capacitor device. There may be a plurality of vertical capacitor elements, each of which may include a cathode, an anode vertically disposed relative to the cathode, and a central capacitance region disposed between the cathode and the anode. Each of the vertical capacitor elements may be defined by a left end and an opposed right end. The stacked vertical capacitor device may also include a plurality of cathode terminals, each of which may correspond to a given one of the plurality of vertical capacitor elements and connected to the cathode thereof. Each of the cathode terminals may have interconnected cathode terminal top and bottom elements. The stacked vertical capacitor device may also include a plurality of anode terminals, each of which may correspond to a given one of the plurality of vertical capacitor elements and connected to the anode thereof. Each of the anode terminals may have interconnected anode terminal top and bottom elements. A given one of the cathode terminal top elements may be coplanar with and isolated from a corresponding one of the anode terminal top elements. Furthermore, a given one of the anode terminal bottom elements may be coplanar with and isolated from a corresponding one of the anode terminal bottom elements.

Another embodiment of the present disclosure may be a capacitor. The capacitor may include one or more first type vertical capacitor elements, each of which may have a top cathode, a bottom anode, and a first orientation central capacitance region between the top cathode and the bottom anode. The capacitor may also include one or more second type vertical capacitor elements, each of which may include a bottom cathode, a top anode, and a second orientation central capacitance region between the bottom cathode and the top anode. The second type vertical capacitor elements may be alternatingly stacked on the first type vertical capacitor elements.

Various embodiments of the disclosure may be methods for fabricating a stacked vertical capacitor device. The method may include embedding a vertical capacitor element within a substrate. The vertical capacitor element may include a first polarity electrode, a second polarity electrode vertically disposed relative to the first polarity electrode, and a central capacitance region disposed between the first polarity electrode and the second polarity electrode. The vertical capacitor element may have a first orientation. The method may further include a step of laminating the vertical capacitor element with an embedding material, as well as exposing metallization surfaces of the vertical capacitor element. The method may include defining one or more vias through a cross section of the substrate, as well as electroplating a top terminal metal plane and a bottom terminal metal plane onto the first polarity electrode and the second polarity electrode of the vertical capacitor element, and the via. There may also be a step of isolating a top first polarity terminal and a top second polarity terminal on the top terminal metal plane, as well as a bottom first polarity terminal and a bottom second polarity terminal on the bottom terminal metal plane. A first one of the vias may connect the top first polarity terminal and the bottom first polarity terminal. A second one of the vias may connect the top second polarity terminal and the bottom second polarity terminal.

In a first type vertical capacitor element, the first polarity electrode may be a cathode and the second polarity electrode may be an anode. In a second type vertical capacitor element, the first polarity electrode may be an anode and the second polarity electrode may be a cathode. One embodiment of the method may further include stacking a second type vertical capacitor element onto a first type vertical capacitor element. The cathode of the first type vertical capacitor element may be connected to the cathode of the second type vertical capacitor element. The anode of the first type vertical capacitor element may be connected to the anode of the second type vertical capacitor element.

Another embodiment of the method may include stacking a second vertical capacitor element atop the top second polarity terminal. The second vertical capacitor element may include a first polarity electrode, a second polarity electrode vertically disposed relative to the first polarity electrode, and a central capacitance region disposed between the first polarity electrode and the second polarity electrode. The second vertical capacitor element may have a second orientation different from the first orientation. The method may further include laminating the second vertical capacitor element with an embedding material, where a laminate layer may be defined thereby. There may also be a step of exposing metallization surfaces of the second vertical capacitor element, as well as a step of defining one or more vias through a cross section of the laminate layer. The method may include electroplating a second top terminal metal plane onto the second polarity electrode of the second vertical capacitor element, and the via. The method may further include isolating a second top first polarity terminal and a second top second polarity terminal on the second top terminal metal plane.

The present disclosure will be best understood accompanying by reference to the following detailed description when read in conjunction with the drawings.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 1 is a cross-sectional view of a stackable and embeddable vertical capacitor device fabricated in accordance with a first embodiment of a fabrication method of the present disclosure;

FIG. 2 is a cross-sectional view of vertical capacitor constituent components that may be adapted for the stackable and embeddable vertical capacitor device shown in FIG. 1;

FIGS. 4A-4G are cross sectional views of the stackable and embeddable vertical capacitor device at various stages of fabrication according to the first embodiment of the fabrication method;

FIG. 5A is a cross-sectional view of a first type capacitor base unit that may be incorporated into the stackable and embeddable vertical capacitor device;

FIG. 5B is a cross-sectional view of a second type capacitor base unit that may be incorporated into the stackable and embeddable vertical capacitor device;

FIGS. 8A-8I are cross sectional views of the stackable and embeddable vertical capacitor device at various stages of fabrication according to the second embodiment of the fabrication method.

DETAILED DESCRIPTION

Figure 3:
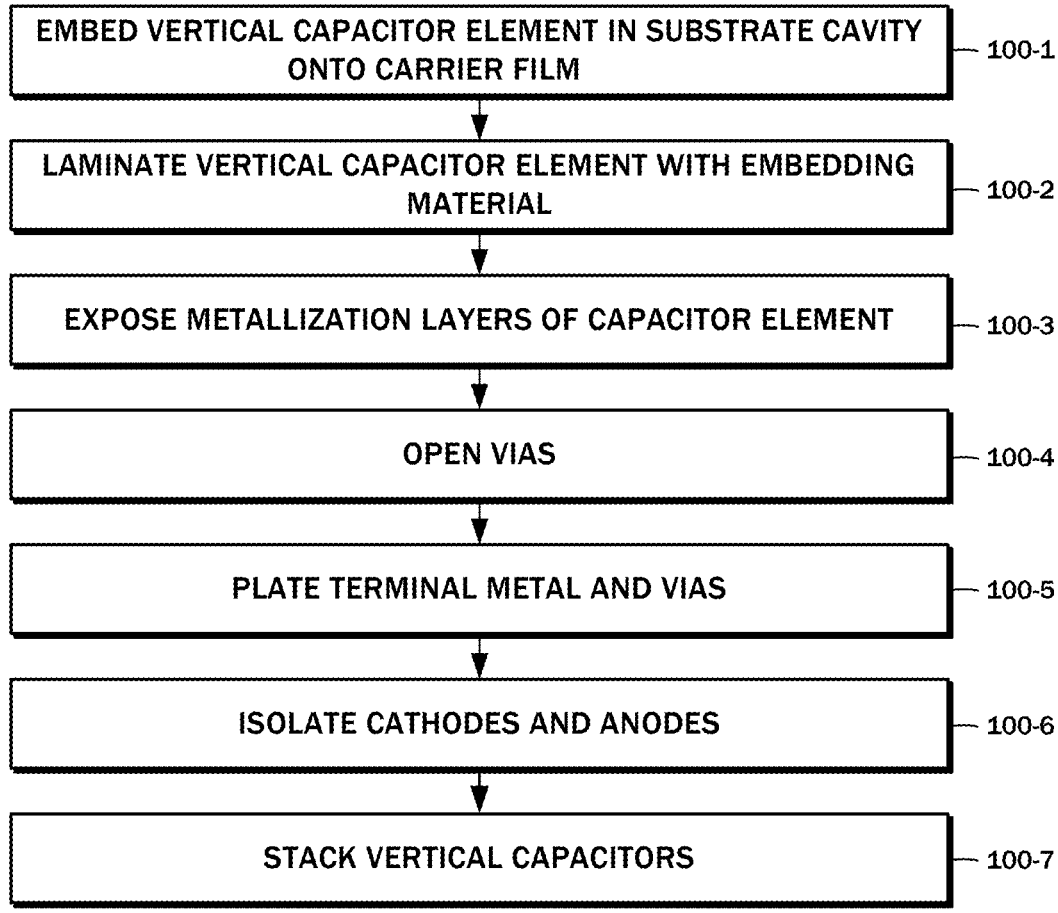
FIG. 3 is a flowchart illustrating the steps of the first embodiment of the fabrication method.

The detailed description set forth below in connection with the appended drawings is intended as a description of the several presently contemplated embodiments of stackable and embeddable vertical capacitor devices in semiconductor devices and methods of their fabrication. It is not intended to represent the only form in which such embodiments may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second, top and bottom, left and right and the like are used solely to distinguish one from another entity without necessarily requiring or implying any actual such order or relationship between such entities.

The cross-sectional diagram of FIG. 1 illustrates one embodiment of a stacked vertical capacitor device 10, which may include a plurality of vertical capacitor elements 12. In the example depicted, the stacked vertical capacitor device includes a first vertical capacitor element 12*a*, a second vertical capacitor element 12*b*, and a third vertical capacitor element 12*c*. It is expressly contemplated that an arbitrary number of vertical capacitor elements 12 may be stacked on to one another, so the three depicted in the illustrated embodiment are presented by way of example only and not of limitation.

FIG. 2 illustrates further details of the vertical capacitor element 12, which includes a cathode 14 as an uppermost layer, an anode 16 as a bottommost layer, and a central capacitance region 18 between the cathode 14 and the anode 16. The cathode 14 may be defined by an exposed exterior surface 15*a* and an unexposed interior surface 15*b*. From the perspective shown in FIG. 2, the exposed exterior surface 15*a* may correspond to a cathode top surface while the unexposed interior surface 15*b* may correspond to a cathode bottom surface. Along the same lines, the anode 16 may be defined by an unexposed interior surface 17*a* and an opposed exterior surface 17*b*. Similarly, the unexposed interior surface 17*a* may correspond to an anode top surface while the exposed exterior surface 17*b* may correspond to an anode bottom surface. Both the cathode 14 and the anode 16 may be a titanium material, a copper material, or any other suitable metal/electrically conductive material.

The central capacitance region 18 is further defined by a solid metal region 20 that is disposed vertically adjacent to the anode 16, and a porous high-surface area metal region 22 that is vertically adjacent to the solid metal region 20. In one embodiment, the solid metal region 20 and the porous high-surface area metal region 22 is defined on an aluminum sheet material 24, with the boundary between the solid metal region 20 and the porous high-surface area metal region 22 not being a precise and straight edge as otherwise depicted. The sheet material 24 may further be defined by a bottom surface 26a that faces the unexposed interior surface 17a/anode top surface, as well as a top surface 26b that is vertically adjacent to a dielectric layer 28. In one embodiment, the dielectric layer 28 may be an aluminum oxide layer that is formed on the aluminum sheet material 24. The dielectric layer 28, the porous high-surface area metal region 22, and the solid metal region 20 may be collectively referred to as a conductive layer.

Vertically adjacent to the dielectric layer 28 may be a solid electrolyte layer 30, which according to an embodiment, may be a sheet of Poly (3,4-ethylenedioxythiophene) polystyrene sulfonate (PEDOT:PSS). Additionally, vertically adjacent to the solid electrolyte layer 30 may be a collector layer 32 of carbon. Thus, from the perspective shown in FIG. 2, the dielectric layer 28 is formed atop the sheet material 24. In turn, the solid electrolyte layer 30 is formed atop the dielectric layer 28, and the collector layer 32 is formed atop the solid electrolyte layer 30. The collector layer 32 faces the unexposed interior surface 15b of the cathode 14.

The foregoing configuration of the vertical capacitor element 12 in which the cathode 14 is the uppermost layer and the anode 16 is the bottommost layer may be referred to as a second orientation. In contrast, in a first orientation, the cathode 14 is the bottommost layer and the anode 16 is the uppermost layer, with the central capacitance region 18, and in particular, the arrangement and ordered configuration of the solid metal region 20, the porous high-surface area metal region 22, the dielectric layer 28, the solid electrolyte layer 30, and the collector layer 32 are correspondingly reversed from bottom to top. Referring again to FIG. 1, the second vertical capacitor element 12b has the second orientation, while the first vertical capacitor element 12a and the third vertical capacitor element 12c has the first orientation. The entire assembly of the vertical capacitor element 12 is defined by a left end 34a and an opposed right end 34b.

The embodiments of the present disclosure contemplate the stacking of the vertical capacitor elements 12 to achieve the stacked vertical capacitor device 10, and with interconnecting terminals, a sequence of the vertical capacitor elements 12 are connected in parallel. Thus, a lower equivalent series resistance and higher capacitance devices are possible. The stacked vertical capacitor device 10 may be embedded into various substrates. The stacked vertical capacitor device 10 has a plurality of cathode terminals 36, and a plurality of anode terminals 38. Each of the cathode terminals 36 corresponds to a given one of the vertical capacitor elements 12 and is connected to the cathode 14 thereof. Likewise, each of the anode terminals 38 corresponds to a given one of the vertical capacitor elements 12 and is connected to the anode 16 thereof. More particularly, a cathode 14a of the first vertical capacitor element 12a is connected to a first cathode terminal 36a, and an anode 16a of the same first vertical capacitor element 12a is connected to a first anode terminal 38a. A cathode 14b of the second vertical capacitor element 12b is connected to a second cathode terminal 36b, and an anode 16b of the second vertical capacitor element 12b is connected to a second anode terminal 38b. Lastly, in this illustrated example, a cathode 14c of the third vertical capacitor element 12c is connected to a third cathode terminal 36c and a corresponding anode 16c is connected to a third anode terminal 38c.

Each of the cathode terminals 36 has a top element and a bottom element, and each of the anode terminals 38 has a top element and a bottom element. In further detail, the first cathode terminal 36a connected to the first vertical capacitor element 12a has a first cathode terminal top element 36a-1 and a first cathode terminal bottom element 36a-2. The second cathode terminal 36b connected to the second vertical capacitor element 12b has a second cathode terminal top element 36b-1 and a second cathode terminal bottom element 36b-2. The third cathode terminal 36c connected to the third vertical capacitor element 12c has a third cathode terminal top element 36c-1 and a third cathode terminal bottom element 36c-2. Similarly, the first anode terminal 38a connected to the first vertical capacitor element 12a has a first anode terminal top element 38a-1 and a first anode terminal bottom element 38a-2. The second anode terminal 38b connected to the second vertical capacitor element 12b has a second anode terminal top element 38b-1 and a second anode terminal bottom element 38b-2. The third anode terminal 38c connected to the third vertical capacitor element 12c has a third anode terminal top element 38c-1 and a third anode terminal bottom element 38c-2.

Each of the cathode terminal top elements is coplanar with and isolated from a corresponding one of the anode terminal top elements, and each of the cathode terminal bottom elements is coplanar with and isolated from a corresponding one of the anode terminal bottom elements. For instance, the first cathode terminal top element 36a-1 is coplanar with and isolated from the first anode terminal top element 38a-1, and the first cathode terminal top element 36a-2 is coplanar with and isolated from the first anode terminal bottom element 38a-2. Similarly, the second cathode terminal top element 36b-1 is coplanar with and isolated from the second anode terminal top element 38b-1, and the second cathode terminal bottom element 36b-2 is coplanar with and isolated from the second anode terminal bottom element 38b-2. As illustrated in the exemplary embodiment, the third cathode terminal top element 36c-1 is coplanar with and isolated from the third anode terminal top element 38c-1, and the third cathode terminal bottom element 36c-2 is coplanar with and isolated from the third anode terminal bottom element 38c-2.

The cathode terminal top elements and the corresponding one of the anode terminal top elements are separated by a gap, as are the cathode terminal bottom elements and the corresponding one of the anode terminal bottom elements. In a first variation, a top gap 40a is defined toward a left end 34a-1 of the first vertical capacitor element 12a between the first cathode terminal top element 36a-1 and the first anode terminal top element 38a-1. A portion of the first anode terminal top element 38a-1 overlaps and is connected to the anode 16a. In the first variation, a bottom gap 40b is also defined toward a right end 34b-1 of the first vertical capacitor element 12a between the first cathode terminal bottom element 36a-2 and the first anode terminal bottom element 38a-2. The cathode 14a overlaps a portion of the first cathode terminal bottom element 36a-2. The cathode terminals and anode terminals for the third vertical capacitor element 12c are similarly configured as in the first variation, in which a top gap 40*a* is defined toward the left end 34*a*-3 of the third vertical capacitor element 12*c*, and a bottom gap 40*b*.

The cathode terminal elements for the second vertical capacitor element 12*b* are an alternative second variation, however. More particularly, a bottom gap 42*a* is defined toward a left end 34*a*-2 of the second vertical capacitor element 12*b* between the second cathode terminal bottom element 36*b*-2 and the second anode terminal bottom element 38*b*-2. A top gap 42*b* is defined toward a right end 34*b*-2 of the second vertical capacitor element 12*b* between the second cathode terminal top element 36*b*-1 and the second anode terminal top element 38*b*-1.

Adjacent to the left and to the right of each of the vertical capacitor elements 12 are insulators 44, including a left insulator 44*a* and a right insulator 44*b*. The left end 34*a*-1 of the first vertical capacitor element 12*a* includes a first left insulator 44*a*-1, while the opposite right end 34*b*-1 includes a first right insulator 44*b*-1. Likewise, the left end 34*a*-2 of the second vertical capacitor element 12*b* includes a second left insulator 44*a*-2 and the opposite right end 34*b*-2 includes a second right insulator 44*b*-2. Lastly, the left end 34*a*-3 of the third vertical capacitor element 12*c* includes a third left insulator 44*a*-3 and the right end 34*b*-3 includes a third right insulator 44*b*-3. In accordance with one embodiment, the left insulator 44*a* and the right insulator 44*b* span the entire thickness of the vertical capacitor element 12, including the cathode 14, the central capacitance region 18, and the anode 16, though such insulators 44 terminate at an interface with the cathode terminals 36 and the anode terminals 38.

Adjacent to an abutting against the insulators 44 are inner build-up layers 46 between the gap 40 and the respective cathode/anode terminal top/bottom elements 36, 38. Further to the left of the first left insulator 44*a*-1 is a first left inner build-up layer 46*a*-1 atop the first cathode terminal bottom element 36*a*-2 and rising to the top gap 40*a*. Further to the right of the first right insulator 44*b*-1 is a first right inner build-up layer 46*b*-1 underneath the first anode terminal top element 38*a*-1 and rising to the bottom gap 40*b*. Further to the left of the second left insulator 44*a*-2 is a second left inner build-up layer 46*a*-2 underneath the second cathode terminal top element 36*b*-1 and extending to the bottom gap 42*a*. Further to the right of the second right insulator 44*b*-2 is a second right inner build-up layer 46*b*-2 atop the second anode terminal bottom element 38*b*-2 and rising to the top gap 42*b*. Further to the left of the third left insulator 44*a*-3 is a third left inner build-up layer 46*a*-3 atop the third cathode terminal bottom element 36*c*-2 and rising to the top gap 40*a*. Further to the right of the third right insulator 44*b*-3 is a third right inner build-up layer 46*b*-3 underneath the third anode terminal top element 38*c*-1 and extending to the bottom gap 40*b*. The inner build-up layers 46 and the insulator 44 may be of the same material such as Ajinomoto® build-up film. In the exemplary embodiment of FIG. 1, the inner build-up layer 46 and the insulator 44 are shown as separate, though connected structures, this is optional. In other embodiments, the inner build-up layers 46 and the insulators 44 may be a unitary structure.

As indicated above, the cathode terminals 36 and the anode terminals 38 each further have top elements and bottom elements. Such top and bottom elements are galvanically and mechanically bridged with vias 48, as well as outer build-up layers 50. On the left side of the first vertical capacitor element 12*a* is a first left via 48*a*-1 extending between the first cathode terminal top element 36*a*-1 and the first cathode terminal bottom element 36*a*-2. Additionally, between the first cathode terminal top element 36*a*-1 and the first cathode terminal bottom element 36*a*-2 is a first left outer build-up layer 50*a*-1. On the right side of the first vertical capacitor element 12*a* is a first right via 48*b*-1 extending between the first anode terminal top element 38*a*-1 and the first anode terminal bottom element 38*a*-2. There is also a first right outer build-up layer 50*b*-1 between the first anode terminal top element 38*a*-1 and the first anode terminal bottom element 38*a*-2. While the various terminal top/bottom elements are described as separate components, this is only for purposes of differentiating one segment from another. In various contemplated embodiments, the top and bottom elements together with the bridging vias are a contiguous, unitary structure.

On the left side of the second vertical capacitor element 12*b* is a second left via 48*a*-2 extending between the second cathode terminal top element 36*b*-1 and the second cathode terminal bottom element 36*b*-2. There is also a second left outer build-up layer 50*a*-2 between the second cathode terminal top element 36*b*-1 and the second cathode terminal bottom element 36*b*-2. On the right side of the second vertical capacitor element 12*b* is a second right via 48*b*-2 extending between the second anode terminal top element 38*b*-1 and the second anode terminal bottom element 38*b*-2. There is a second right outer build-up layer 50*b*-2 between the second anode terminal top element 38*b*-1 and the second anode terminal bottom element 38*b*-2.

On the left side of the third vertical capacitor element 12*c* is a third left via 48*a*-3 extending between the third cathode terminal top element 36*c*-1 and the third cathode terminal bottom element 36*c*-2. There is a third left outer build-up layer 50*a*-3 between the third cathode terminal top element 36*c*-1 and the third cathode terminal bottom element 36*c*-2. On the right side of the third vertical capacitor element 12*c* is a third right via 48*b*-3 extending between the third anode terminal top element 38*c*-1 and the third anode terminal bottom element 38*c*-2. There is a third right outer build-up layer 50*b*-3 between the third anode terminal top element 38*c*-1 and the third anode terminal bottom element 38*c*-2.

Various embodiments of the present disclosure contemplate the stacking and parallel connection of the vertical capacitor elements 12, in which each of the cathodes are connected together and each of the anodes are connected together. In this regard, the cathode terminals 36*a*-36*c* are connected together, and the anode terminals 38*a*-38*c* are connected together. Specifically, the first cathode terminal top element 36*a*-1 is adjacent and connected to the second cathode terminal bottom element 36*b*-2, with a first cathode bonding layer 52*a* in between. The second cathode terminal top element 36*b*-1, in turn, is connected to the third cathode terminal bottom element 36*c*-2. There is also a second cathode bonding layer 52*b* between the second cathode terminal top element 36*b*-1 and the third cathode terminal bottom element 36*c*-2. In similar fashion, the first anode terminal top element 38*a*-1 is connected to the second anode terminal bottom element 38*b*-2 with a first anode bonding layer 54*a* in between, and the second anode terminal top element 38*b*-1 is connected to the third anode terminal bottom element 38*c*-2 with a second anode bonding layer 54*b* in between. The aforementioned bonding layers 52, 54 are understood to be a conductive paste, though any other suitable material may be substituted without departing from the scope of the present disclosure.

The present disclosure includes various embodiments of a method for fabricating the stacked vertical capacitor device 10. Referring now to the flowchart of FIG. 3 as well as the cross-sectional view of the stacked vertical capacitor device 10 in an initial state of fabrication shown in FIG. 4A, the method begins with a step 100-1 of embedding the vertical capacitor element 12 into a cavity 56 of a substrate 58. In further detail, the substrate 58 may be a copper-clad laminate with a top metal layer 60 and a bottom metal layer 62, and an insulating substrate layer 64 between the top metal layer 60 and the bottom metal layer 62. The substrate 58 as well as the vertical capacitor element 12 may be mounted onto a carrier film 66. In the illustrated embodiment of the vertical capacitor element 12, the cathode 14 is on the uppermost layer while the anode 16 is on the bottommost layer, with the central capacitance region 18 being oriented accordingly as described above.

According to some embodiments, the cathode 14 may be referred to as a first polarity electrode while the anode 16 may be referred to as a second polarity electrode. As will be described in further detail below, the polarity may be reversed, with the first polarity electrode being the anode 16 and the second polarity electrode being the cathode 14. This is because the method of fabrication may be adapted for a vertical capacitor element 12 in which the uppermost layer is the anode 16 and the bottommost layer is the cathode 14, with the central capacitance region 18 being in the opposite orientation. Notwithstanding the polarity reversal, the fabrication steps are understood to remain unchanged and the method is applicable to both types, so for the sake of consistency, the respective electrodes of the vertical capacitor element 12 will be referenced by more general terms. When describing the steps of the fabrication method as illustrated in FIGS. 4A-4G, however, the more specific forms (e.g., cathode and anode) will be used.

Referring now to FIG. 4B and the flowchart of FIG. 1, the method continues with a step 100-2 of laminating the vertical capacitor element 12 with an embedding material 68. In this step, the embedding material 68 fills remaining crevices in the cavity 56, and envelopes the top metal layer 60 of the substrate 58 and the cathode 14 of the vertical capacitor element 12. The embedding material 68 may be a build-up film or other photo-imageable dielectric material.

Next, with reference to FIG. 4C, the method continues with a step 100-3 of exposing the metallization layers. The specifics of this step are understood to vary depending on the embedding material 68. For instance, this step may involve planarization, or may be imaged and developed using a photolithography process that exposes the metallization of the vertical capacitor elements 12. Regardless of the specifics, the step concludes with the cathode 14 and the top metal layer 60 of the substrate 58 becoming exposed, while the embedding material 68 remains within the cavity 56, isolating the ends of the vertical capacitor element 12 from the top metal layer 60, the bottom metal layer 62, and the insulating substrate layer 64. In this regard, this portion of the embedding material 68 may correspond to the aforementioned insulators 44.

The cross-sectional view of FIG. 4D illustrates the following step 100-4 of defining or opening the vias 48. As described earlier, the vias 48 extend from the top metal layer 60 to the bottom metal layer 62, and are defined in the substrate 58 to the left and to the right of the vertical capacitor element 12. The vias 48 are understood to allow for the routing of connections to the cathodes 14 and the anodes 16. Accordingly, there is a left via 48a and a right via 48b. One embodiment of the present disclosure contemplates lasing the vias 48.

Figure 4E:
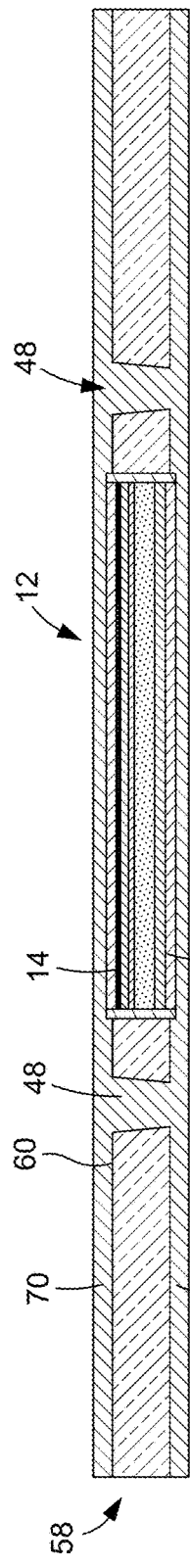

FIG. 4E depicts the next step 100-5 of electroplating a top terminal metal plane 70 and a bottom terminal metal plane 72 onto the electrodes of the vertical capacitor element 12. In particular, the top terminal metal plane 70 is electroplated onto the cathode 14 of the vertical capacitor element 12 and the top metal layer 60 of the substrate 58, and the bottom terminal metal plane 72 is electroplated onto the anode 16 of the vertical capacitor element 12 and the bottom metal layer 62 of the substrate 58. This step further includes electroplating the vias 48. There may be a precursor step of laying down seed layers on the exposed surfaces of top metal layer 60, the bottom metal layer 62, the vias 48, and the electrodes of the vertical capacitor element 12. These seed layers may be formed through electroless deposition or sputtering, and is understood to facilitate the electroplating process.

The method continues with a step 100-6 of isolating the cathode and anode. With reference to FIG. 4F and the flowchart of FIG. 3, this involves defining the top gap 42 on the top terminal metal plane 70, resulting in the cathode terminal top element 36-1 and the anode terminal top element 38-1. Additionally, this also involves defining the bottom gap 40 on the bottom terminal metal plane 72, resulting in the cathode terminal bottom element 36-2 and the anode terminal bottom element 38-2. This isolation step may be achieved through etching or lasing processes. As indicated above, the left via 48a bridges and connects together the cathode terminals 36, e.g., the cathode terminal top element 36-1 and the cathode terminal bottom element 36-2, while the right via 48b bridges and connects together the anode terminals 38, e.g., the anode terminal top element 38-1 and the anode terminal bottom element 38-2. The entirety of the structure illustrated in FIG. 4F may be referred to as a capacitor unit 74.

The present disclosure contemplates the stacking of multiple capacitor units 74 to yield the stacked vertical capacitor device 10. Referring to FIG. 5A, a first type capacitor unit 74a features the vertical capacitor element 12-1 of a first variation in which the cathode 14 is at the bottom while the anode 16 is at the top, with the central capacitance region 18 being oriented such that the solid metal region 20 thereof is immediately underneath the anode 16 and the collector layer 32 is immediately above the cathode 14. Accordingly, while the cathode terminals 36 extend toward the left and the anode terminals 38 extend toward the right, the bottom gap 40 separating the cathode terminal 36/cathode terminal bottom element 36-2 and the anode terminal 38/anode terminal bottom element 38-2 is on the right side, and the top gap 42 separating the cathode terminal 36/cathode terminal top element 36-1 and the anode terminal 38/anode terminal top element 38-1 is on the left side.

FIG. 5B illustrates a different, second type capacitor unit 74b, which incorporates a second variation of the vertical capacitor element 12-2 in which the cathode 14 is at the top while the anode 16 is at the bottom. The central capacitance region 18 is accordingly in an inverse orientation to that of the first type capacitor unit 74, with the solid metal region 20 being atop the anode 16 and the collector layer 32 is immediately underneath the cathode 14. Again, the cathode terminals 36 extend toward the left and the anode terminals 38 extend toward the right. However, the bottom gap 40 separating the cathode terminal 36/cathode terminal bottom element 36-2 and the anode terminal 38/anode terminal 38-2 is on the left side while the top gap 42 separating the cathode terminal 36/cathode terminal top element 36-1 and the anode terminal 38/anode terminal top element 38-1 is on the right side.

Figure 4F:
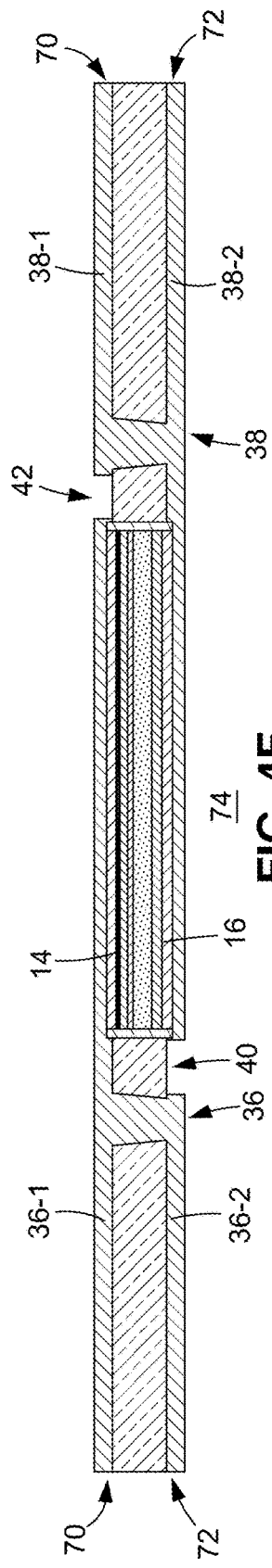
Figure 4G:
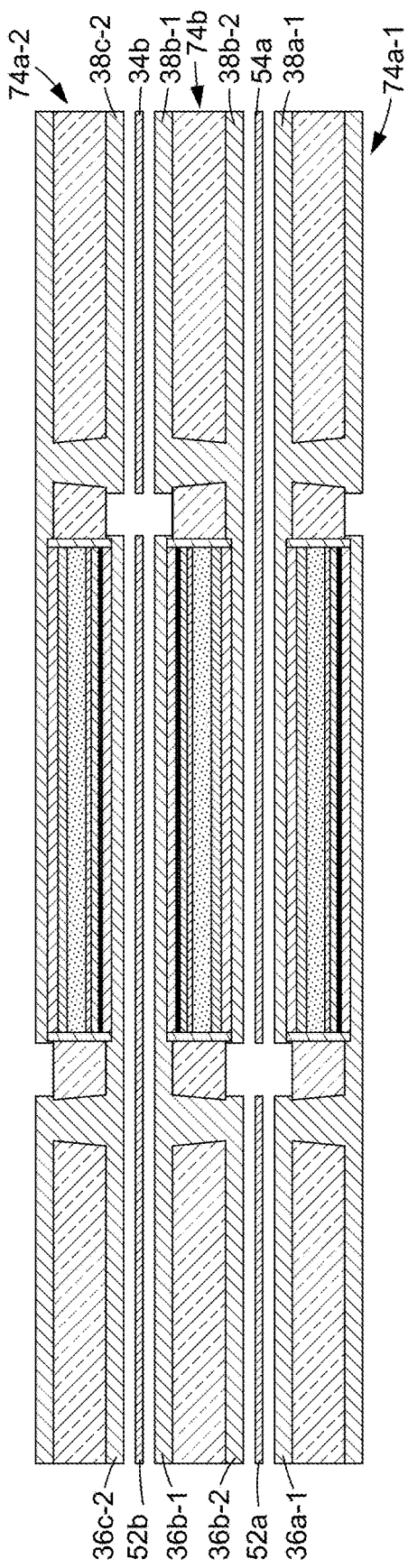

Returning to the flowchart of FIG. 3 and the cross-sectional view of FIG. 4G, the method includes a step 100-7 of stacking the vertical capacitor element 12, and more specifically, the capacitor units 74. The stacking alternates between the first type capacitor unit 74a and the second type capacitor unit 74b, and in the example shown, the bottom-most one is a first type capacitor unit 74a-1, atop which a second type capacitor unit 74b is stacked. In between the first type capacitor unit 74a-1 and the second type capacitor unit 74b, that is, between the first cathode terminal top element 36a-1 and the second cathode bottom element 36b-2 is the first cathode bonding layer 52a, and between the first anode terminal top element 38a-1 and the second anode terminal bottom element 38b-2, there is the first anode bonding layer 54a. Further, in between the second type capacitor unit 74b and the second, first type capacitor unit 74a-2, that is, between the second cathode terminal top element 36b-1 and the third cathode terminal bottom element 36c-2, there is the second cathode bonding layer 52b, and between the second anode terminal top element 38b-1 and the third anode terminal bottom element 38c-2 there is the second anode bonding layer 54b. As indicated above, cathode bonding layers 52 and the anode bonding layers 54 are understood to be a conductive paste material.

The alternating configuration of the first type capacitor unit 74a and the second type capacitor unit 74b permit the parallel connection of the vertical capacitor elements 12 in the stacked vertical capacitor device 10, where each of the cathodes 14 are connected in common and each of the anodes 16 are connected common. With this alternating configuration of the first and second type capacitor units 74, any arbitrary number of capacitor units 74 may be stacked to achieve desired performance or dimension parameters. Furthermore, the stacked vertical capacitor device 10 may be embedded within substrates, with connections for passing through signals being possible. The configuration is also contemplated to be compatible with volume manufacturing.

Figure 6:
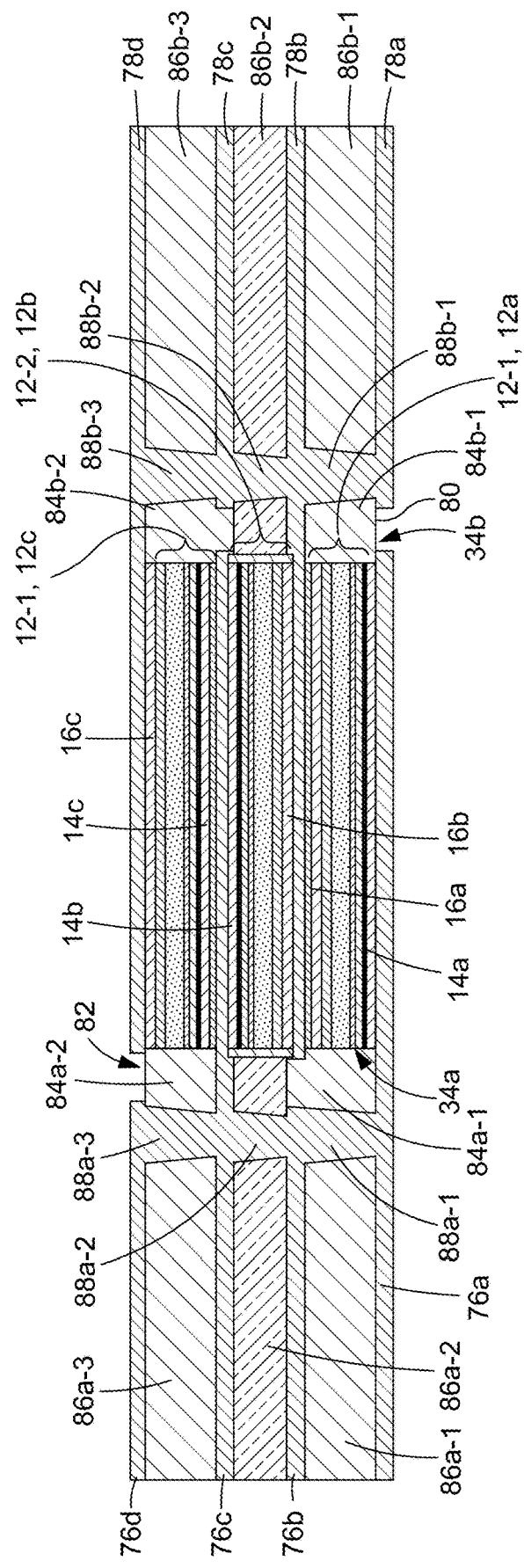
FIG. 6 is a cross-sectional view of the stackable and embeddable vertical capacitor device fabricated in accordance with a second embodiment of the fabrication method of the present disclosure.

FIG. 6 depicts an alternative embodiment of the stacked vertical capacitor device 10, which results from an alternative manufacturing process that will be described in further detail below. This embodiment retains the same alternating stacking of the first variation of the vertical capacitor element 12-1 and the second variation of the vertical capacitor element 12-2. Instead of stacking discrete capacitor units 74 that each include top and bottom terminal elements, there are fewer terminal elements.

The first vertical capacitor element 12a at the bottommost position on the stack incorporates a cathode 14a that is connected to a first cathode terminal element 76a. Coplanar with a first cathode terminal element 76a but separated by a bottom gap 80 and a first right insulator 84b-1 on the right end 34b is the first anode terminal element 78a. The second anode terminal element 78b is connected to the anode 16a of the first vertical capacitor element 12a as well as the anode 16b of the second vertical capacitor element 12b. The first anode terminal element 78a is connected to the second anode terminal element 78b with a first right via 88b-1, and a first right build-up layer 86b-1 is disposed between the first anode terminal element 78a and the second anode terminal element 78b.

A second cathode terminal element 76b is coplanar with the second anode terminal element 78b, but a first left insulator 84a-1 is interposed between such components. A first left via 88a-1 connects the first cathode terminal element 76a to the second cathode terminal element 76b. Furthermore, a first left build-up layer 86a-1 is disposed between the first cathode terminal element 76a and the second cathode terminal element 76b.

The cathode 14b of the second vertical capacitor element 12b and the cathode 14c of the third vertical capacitor element 12c are both connected to a third cathode terminal element 76c. The second cathode terminal element 76b is connected to the third cathode terminal element 76c with the second left via 88a-2. There is also a second left build-up layer 86a-2 that corresponds to the depth of the second left via 88a-2.

A third anode terminal element 78c is coplanar with the third cathode terminal element 76c, but a second right insulator 84b-2 is disposed between the two components and are isolated from each other. A second right via 88b-2 connects the third anode terminal element 78c and the second anode terminal element 78b, and a second right build-up player 86b-2 is disposed between the third anode terminal element 78c and the second anode terminal element 78b.

A fourth anode terminal element 78d is connected to the anode 16c of the third vertical capacitor element 12c. A third right via 88b-3 connects the third anode terminal element 78c and the fourth anode terminal element 78d, while a third right build-up layer 86b-3 is disposed between third anode terminal element 78c and the fourth anode terminal element 78d. The second right insulator 84b-2 also isolates the third vertical capacitor element 12c from the fourth anode terminal element 78d and the third via 88b-3.

Coplanar with the fourth anode terminal element 78d is a fourth cathode terminal element 76d. There is a top gap 82 defined to the left of the third vertical capacitor element 12c, separating the fourth anode terminal element 78d from the fourth cathode terminal element 76d. A third left via 88a-3 connects the fourth cathode terminal element 76d with the third cathode terminal element 76c, with a third left build-up layer 86a-3 disposed between the fourth cathode terminal element 76d and the third cathode terminal element 76c. Additionally, there is a second left insulator 84a-2 to the left of the third vertical capacitor element 12c that serves to isolate the same from the third left via 88a-3.

Figure 7:
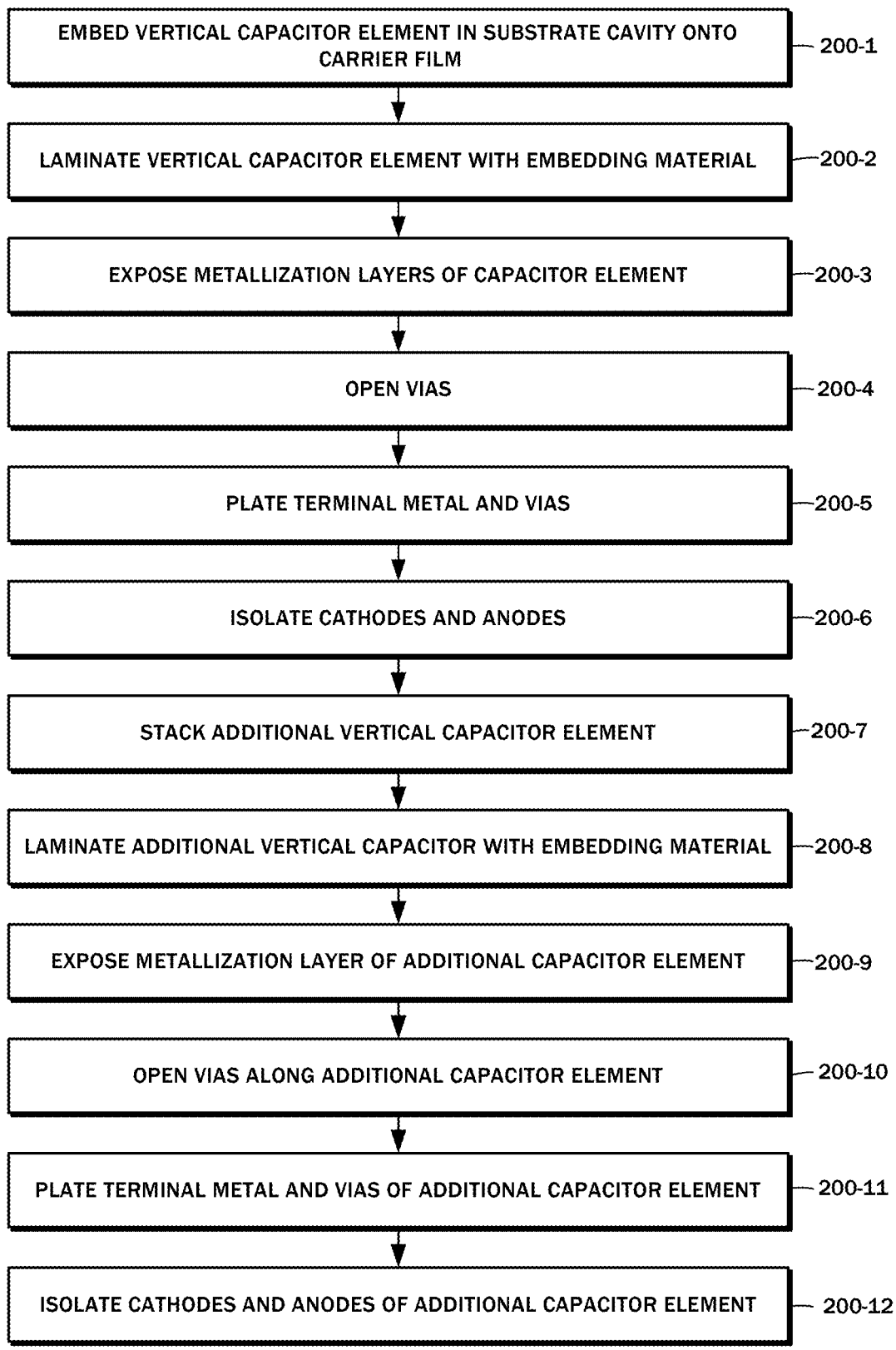
FIG. 7 is a flowchart illustrating the steps of the second embodiment of the fabrication method.

The alternative embodiment of the stacked vertical capacitor device 10 may be fabricated in accordance with a method shown in the flowchart of FIG. 7. The cross-sectional views of FIGS. 8A-8I illustrate such stacked vertical capacitor device 10 at various stages of completion in accordance with this method. The first six steps of the method are identical to the first embodiment of the process described above in connection with the flowchart of FIG. 3, and steps 100-1, 100-2, 100-3, 100-4, 100-5, and 100-6 correspond to step 200-1 of embedding the vertical capacitor element 12 into the cavity of the substrate, step 100-2 of laminating the vertical capacitor element 12 with the embedding material, step 100-3 of exposing the metallization layers, step 100-4 of defining or opening the vias, step 100-5 of electroplating the top terminal metal plane and the bottom terminal metal plane onto the electrodes of the vertical capacitor element 12, and step 100-6 of isolating the cathode and anode.

Referring now to FIG. 8A, a state of the stacked vertical capacitor device 10 is shown with the vias 88 filled, and a top terminal metal plane 90 and a bottom terminal metal plane 92 electroplated onto the cathode 14 and anode 16 of the vertical capacitor element 12. FIG. 8B shows the stacked vertical capacitor device 10 following the step 200-6 of isolating the cathode 14 and anode 16, with a cathode terminal top element 76-1 separated from the anode terminal top element 78-1 over a gap 94, and a cathode terminal bottom element 76-2 separated from the anode terminal bottom element 78-2 over a gap 96.

With additional reference to FIG. 8C and the flowchart of FIG. 7, the method continues with a step 200-7 of stacking an additional vertical capacitor element 12' onto the existing assembly atop the cathode terminal top element 76-1. There may be a bonding layer 98 such as conductive paste between the cathode 14 of the additional vertical capacitor element 12' and the cathode terminal top element 76-1.

FIG. 8D illustrates the completion of the next step 200-8 of the method of laminating the additional vertical capacitor element 12' with the embedding material 68. This envelopes the additional vertical capacitor element 12', as well as the previously existing gap 94 between the cathode terminal top element 76-1 and the anode terminal top element 78-1.

The method continues with a step 200-9 of exposing the metallization layers. As shown in FIG. 8E, this step concludes with the anode 16 of the additional vertical capacitor element 12 becoming exposed.

FIG. 8F illustrates the completion of a step 200-10 of defining or opening the vias 88. The vias 88 extend the entire thickness of the embedding material 68 to the cathode terminal top element 76-1 and the anode terminal top element 89-1, and are defined in the embedding material 68 to the left and to the right of the additional vertical capacitor element 12'. Again, the vias 88 allow for the routing of connections to the cathodes 14 and the anodes 16 of the other vertical capacitor element 12. Thus, there is a left via 88*a* and a right via 88*b*.

FIG. 8G depicts the next step 200-11 of electroplating the terminal metal and vias onto the electrode/anode 16 of the additional vertical capacitor element 12' as well as the top surface of the embedding material 68. An additional top metal layer or terminal metal plane 90' is thereby formed, and becomes structurally and galvanically connected to the vias 88.

Figure 8H:
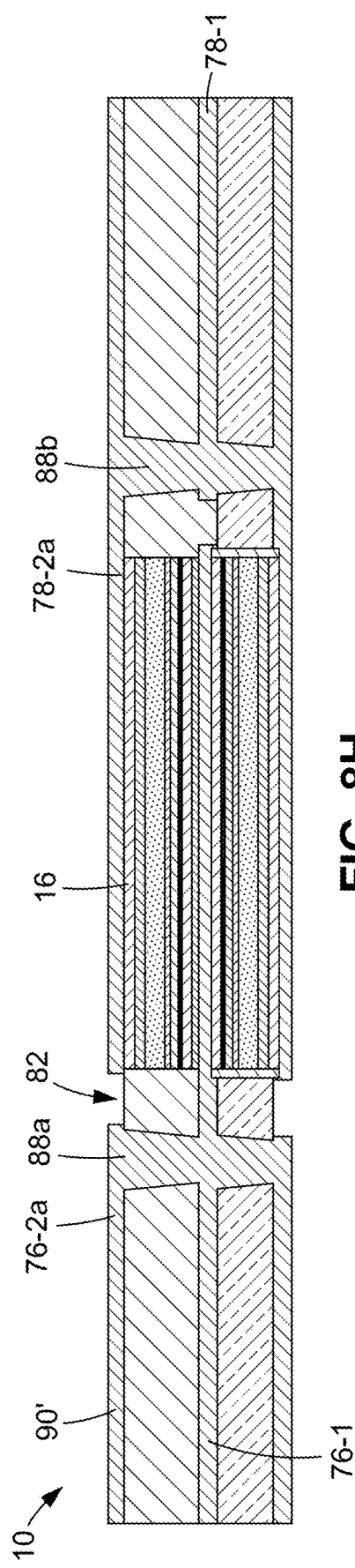

The method continues with a step 200-12 of isolating the cathode 14 and the anode 16 of the additional vertical capacitor element 12'. With reference to FIG. 8H, this involves defining the gap 82 on the terminal metal plane 90', resulting in the cathode terminal element 76-2*a* and the anode terminal element 78-2*b*. As indicated above, the left via 88*a* bridges and connects together the cathode terminals 76, e.g., the cathode terminal element 76-2*a* and the cathode terminal element 76-1, while the right via 88*b* bridges and connects together the anode terminals 78, e.g., the anode terminal element 78-2*a* and the anode terminal element 78-1.

Figure 8I:
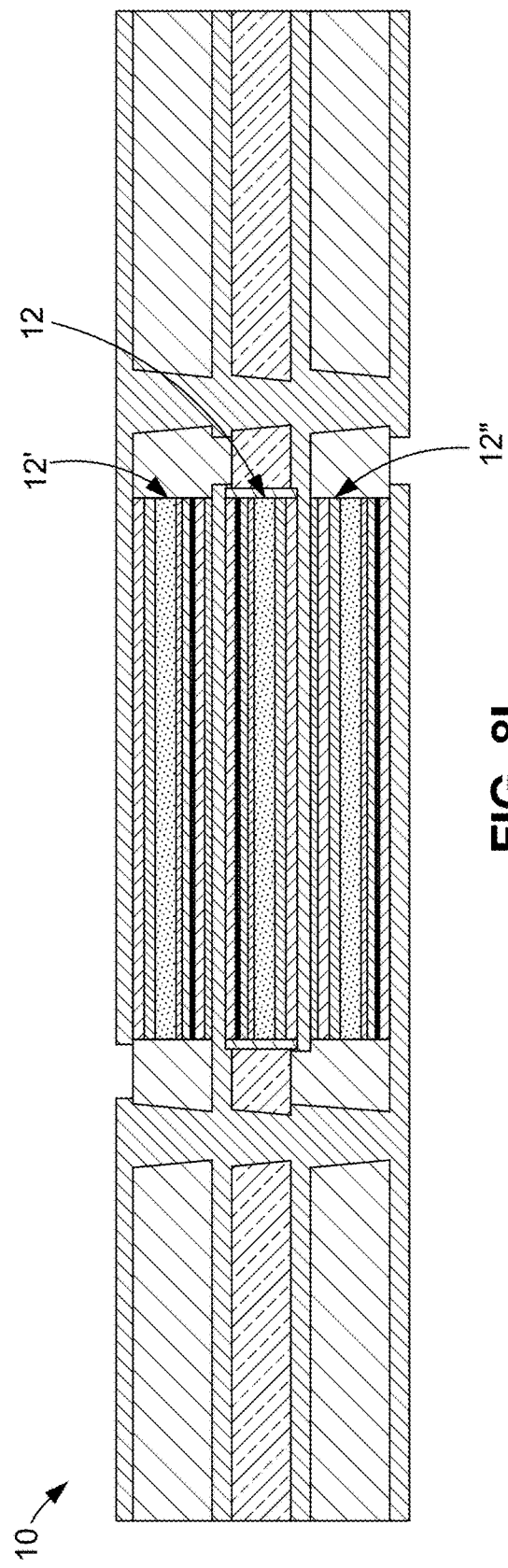

The foregoing process may be repeated as shown in FIG. 8I, where there may be a plurality of vertical capacitor elements 12, 12' and 12", each one having an inverse orientation of the cathode-central capacitance region-anode arrangement relative to an adjacent one thereto. Again, an arbitrary number of vertical capacitor elements 12 may be stacked, with each cathode 14 in the assembly being connected together and each anode 16 in the assembly being connected together, such that the vertical capacitor elements 12 are connected in parallel.

The particulars shown herein are by way of example and for purposes of illustrative discussion of the embodiments of the stackable and embeddable vertical capacitor and are presented in the cause of providing what is believed to be the most useful and readily understood description of the principles and conceptual aspects. In this regard, no attempt is made to show details with more particularity than is necessary, the description taken with the drawings making apparent to those skilled in the art how the several forms of the present disclosure may be embodied in practice.

What is claimed is:

1. A method for fabricating a stacked vertical capacitor device, the method comprising:

embedding within a substrate a vertical capacitor element including a first polarity electrode, a second polarity electrode vertically disposed relative to the first polarity electrode, and a central capacitance region disposed between the first polarity electrode and the second polarity electrode, the vertical capacitor element having a first orientation;

laminating the vertical capacitor element with an embedding material;

exposing metallization surfaces of the vertical capacitor element;

defining one or more vias through a cross section of the substrate;

electroplating a top terminal metal plane and a bottom terminal metal plane onto the first polarity electrode and the second polarity electrode of the vertical capacitor element, and the via; and isolating, on the top terminal metal plane, a top first polarity terminal and a top second polarity terminal, and on the bottom terminal metal plane, a bottom first polarity terminal and a bottom second polarity terminal, a first one of the vias connecting the top first polarity terminal and the bottom first polarity terminal and a second one of the vias connecting the top second polarity terminal and the bottom second polarity terminal.

2. The method of claim 1, wherein the first polarity electrode is a cathode and the second polarity electrode is an anode in a first type vertical capacitor element, and the first polarity electrode is an anode and the second polarity electrode is a cathode in a second type vertical capacitor element.

3. The method of claim 2, further comprising:
stacking a second type vertical capacitor element onto a first type vertical capacitor element, the cathode of the first type vertical capacitor element being connected to the cathode of the second type vertical capacitor element, and the anode of the first type vertical capacitor element being connected to the anode of the second type vertical capacitor element.

4. The method of claim 2, wherein:
the top first polarity terminal and the top second polarity terminal are isolated by a first gap defined toward a left end of the first type vertical capacitor element; and
the bottom first polarity terminal and the bottom second polarity terminal are isolated by a second gap defined toward a right end of the first type vertical capacitor element.

5. The method of claim 2, wherein:
the top first polarity terminal and the top second polarity terminal are isolated by a first gap defined toward a right end of the second type vertical capacitor element; and
the bottom first polarity terminal and the bottom second polarity terminal are isolated by a second gap defined toward a left end of the second type vertical capacitor element.

6. The method of claim 1, further comprising:
stacking, atop the top second polarity terminal, a second vertical capacitor element including a first polarity electrode, a second polarity electrode vertically disposed relative to the first polarity electrode, and a central capacitance region disposed between the first polarity electrode and the second polarity electrode, the second vertical capacitor element having a second orientation different from the first orientation;

laminating the second vertical capacitor element with an embedding material, a laminate layer being defined thereby;

exposing metallization surfaces of the second vertical capacitor element;

defining one or more vias through a cross section of the laminate layer;

electroplating a second top terminal metal plane onto the second polarity electrode of the second vertical capacitor element, and the via; and isolating, on the second top terminal metal plane, a second top first polarity terminal and a second top second polarity terminal.

7. The method of claim 6, wherein:

the top first polarity terminal and the top second polarity terminal are isolated by a top gap defined toward a right end of the vertical capacitor element; and the bottom first polarity terminal and the bottom second polarity terminal are isolated by bottom gap defined toward a left end of the second type vertical capacitor element.

8. The method of claim 7, wherein the second top first polarity terminal and the second top second polarity terminal are isolated by a top gap defined toward a left end of the second vertical capacitor element.

9. The method of claim 6, wherein:

the first polarity electrode of the vertical capacitor element and the second vertical capacitor element are cathodes; and the second polarity electrode of the vertical capacitor element and the second vertical capacitor element are anodes.

10. A method for fabricating a stacked vertical capacitor device, the method comprising:

fabricating a first capacitor base unit with a top cathode terminal, a top anode terminal, a bottom cathode terminal, and a bottom anode terminal;

fabricating a second capacitor base unit with a top cathode terminal, a top anode terminal, a bottom cathode terminal, and a bottom anode terminal;

applying a conductive bonding layer onto the first capacitor base unit; and stacking the second capacitor base unit onto the first capacitor base unit with the top anode terminal of the first capacitor base unit being connected to the bottom anode terminal of the second capacitor base unit, and the top cathode terminal of the first capacitor base unit being connected to the bottom cathode terminal of the second capacitor base unit.

11. The method of claim 10, further comprising:

applying a conductive bonding layer onto the second capacitor base unit; and stacking a third capacitor base unit with a top cathode terminal, a top anode terminal, a bottom anode terminal, and a bottom cathode terminal onto the second capacitor base unit with the top anode terminal of the second capacitor base unit being connected to the bottom anode terminal of the third capacitor base unit, and the top cathode terminal of the second capacitor base unit being connected to the bottom cathode terminal of the third capacitor base unit.

12. The method of claim 10 wherein:

the first capacitor base unit includes a first vertical capacitor element in a first orientation with a top cathode connected to the top cathode terminal of the first capacitor base unit and a bottom anode connected to the bottom anode terminal of the first capacitor base unit; and the second capacitor base unit includes a second vertical capacitor element in a second orientation with a top anode connected to the top anode terminal of the second capacitor base unit and a bottom cathode connected to the bottom cathode terminal of the second capacitor base unit.

13. The method of claim 12, wherein:

the top cathode terminal and the top anode terminal of the first capacitor base unit are spaced apart from one another and define a first gap on a left side of the first vertical capacitor element; and the bottom cathode terminal and the bottom anode terminal of the first capacitor base unit are spaced apart from one another and define a second gap on a right side of the first vertical capacitor element.

14. The method of claim 12, wherein:

the top cathode terminal and the top anode terminal of the second capacitor base unit are spaced apart from one another and define a first gap on a right side of the second vertical capacitor element; and the bottom cathode terminal and the bottom anode terminal of the second capacitor base unit are spaced apart from one another and define a second gap on a right side of the second vertical capacitor element.

15. The method of claim 10 wherein fabricating a first capacitor base unit includes:

embedding within a substrate a vertical capacitor element with a cathode, an anode, and a central capacitance region between the cathode and the anode;

laminating the vertical capacitor element with an embedding material;

exposing metallization surfaces of the vertical capacitor element;

electroplating a top terminal metal plane and a bottom terminal metal plane onto the vertical capacitor element;

separating the top terminal metal plane to the top cathode terminal and the top anode terminal, and the bottom terminal metal plane to the bottom cathode terminal and the bottom anode terminal.

16. A method for fabricating a stacked vertical capacitor device, the method comprising:

arranging a plurality of alternatingly oriented capacitor base units each with first polarity terminals and second polarity terminals, adjacent ones of the alternatingly oriented capacitor base units being oriented with the first polarity terminals of respective ones of the capacitor base units and the second polarity terminals of respective ones of the capacitor base units facing each other; and attaching the first polarity terminals of the adjacent ones of the alternatingly oriented capacitor base units and the second polarity terminals of the adjacent ones of the alternatingly oriented capacitor base units.

17. The method of claim 16, wherein each of the capacitor base units are individually fabricated by:

embedding within a substrate a vertical capacitor element with a first polarity electrode, a second polarity electrode, and a central capacitance region between the first polarity electrode and the second polarity electrode;

laminating the vertical capacitor element with an embedding material;

exposing metallization surfaces of the vertical capacitor element;

electroplating a top terminal metal plane and a bottom terminal metal plane onto the vertical capacitor element;

separating the top terminal metal plane to a top first polarity terminal and a top second polarity terminal, and the bottom terminal metal plane to the bottom first polarity terminal and a bottom second polarity terminal.

18. The method of claim 17, wherein:

the top first polarity terminal and the top second polarity terminal are spaced apart from one another and define a first gap on a side of the vertical capacitor element; and the bottom first polarity terminal and the bottom second polarity terminal of the are spaced apart from one another and define a second gap on a side of the vertical capacitor element opposite the first gap.

19. The method of claim 16, wherein prior to attaching the first polarity terminals of the adjacent ones of the alternatingly oriented capacitor base units and the second polarity terminals of the adjacent ones of the alternatingly oriented capacitor base units, the method includes applying a conductive bonding layer onto either of the first polarity terminals and either of the second polarity terminals.

20. The method of claim 16, wherein:

the first polarity terminals of the capacitor base units are cathodes; and the second polarity terminals of the capacitor base units are anodes.

* * * * *